(12) United States Patent
Rainer et al.

(10) Patent No.: US 9,596,756 B2
(45) Date of Patent: Mar. 14, 2017

(54) ELECTRONIC DEVICE WITH PRINTED CIRCUIT BOARD NOISE REDUCTION USING ELASTOMERIC DAMMING AND DAMPING STRUCTURES

(71) Applicant: Apple Inc., Cupertino, CA (US)

(72) Inventors: Amanda R. Rainer, Santa Clara, CA (US); Connor R. Duke, Sunnyvale, CA (US); James W. Bilanski, Palo Alto, CA (US); Jeffrey M. Thoma, Mountain View, CA (US); Michael Eng, San Jose, CA (US); Mingzhe Li, Tianjin (CN); Sung Woo Yoo, Santa Clara, CA (US); Miguel Alejandro Lara-Pena, Gilroy, CA (US); Weng Choy Foo, Shanghai (CN); Kieran Poulain, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 638 days.

(21) Appl. No.: 14/020,059

(22) Filed: Sep. 6, 2013

(65) Prior Publication Data

US 2015/0070864 A1 Mar. 12, 2015

(51) Int. Cl.
*H05K 1/03* (2006.01)
*H01L 21/56* (2006.01)
(Continued)

(52) U.S. Cl.
CPC ......... *H05K 1/0393* (2013.01); *H01L 21/563* (2013.01); *H01L 25/0655* (2013.01);
(Continued)

(58) Field of Classification Search
USPC ......................................... 361/782
See application file for complete search history.

(56) References Cited

U.S. PATENT DOCUMENTS 7,047,633 B2   5/2006  Morganeli et al.
7,095,112 B2 * 8/2006  Endo ...................... H01L 23/50
                                                    257/724
(Continued)

OTHER PUBLICATIONS

Arnold et al., U.S. Appl. No. 13/644,280, filed Oct. 4, 2012.

*Primary Examiner* — Eric Thomas
*Assistant Examiner* — Michael P McFadden
(74) *Attorney, Agent, or Firm* — Treyz Law Group, P.C.; G. Victor Treyz; Joseph F. Guihan

(57) ABSTRACT

An electronic device may be provided with integrated circuits and electrical components such as capacitors that are soldered to printed circuit boards. Liquid polymer adhesive such as encapsulant and underfill materials may be deposited on the printed circuit. Electrical components such as capacitors may be coated with the encapsulant. The underfill may be deposited adjacent to an integrated circuit, so that the underfill wicks into a gap between the integrated circuit and the printed circuit board. The encapsulant may be more viscous than the underfill and may therefore prevent the flowing underfill from reaching the electrical components. Some of the encapsulant may be located between the electrical components and the printed circuit board. The encapsulant can be cured to form an elastomeric material covering the electrical components that helps damp vibrations. The elastomeric material may be less stiff than the underfill.

8 Claims, 10 Drawing Sheets

(51) Int. Cl.
*H05K 3/28* (2006.01)
*H01L 25/065* (2006.01)
*H05K 1/18* (2006.01)

(52) U.S. Cl.
CPC .... *H05K 3/284* (2013.01); *H01L 2224/73204* (2013.01); *H05K 1/181* (2013.01); *H05K 2201/0133* (2013.01); *H05K 2201/10015* (2013.01); *H05K 2201/10977* (2013.01); *H05K 2201/2045* (2013.01); *H05K 2203/0126* (2013.01); *H05K 2203/304* (2013.01)

(56) References Cited

U.S. PATENT DOCUMENTS

| | | |
|---|---|---|
| 7,148,560 B2 | 12/2006 | Lee et al. |
| 7,213,739 B2 | 5/2007 | Wilson et al. |
| 8,115,304 B1 * | 2/2012 | Joshi ................. H01L 23/10 257/704 |
| 2006/0142424 A1 | 6/2006 | Shah et al. |
| 2007/0244398 A1 * | 10/2007 | Lo ..................... A61B 5/02444 600/500 |
| 2008/0315410 A1 * | 12/2008 | Johnson ................. H01L 21/563 257/737 |
| 2012/0159118 A1 | 6/2012 | Wong et al. |
| 2012/0298407 A1 * | 11/2012 | Ahn ..................... H05K 1/111 174/260 |
| 2013/0063917 A1 | 3/2013 | Choi et al. |
| 2013/0154079 A1 | 6/2013 | Kim et al. |

* cited by examiner

ELECTRONIC DEVICE WITH PRINTED CIRCUIT BOARD NOISE REDUCTION USING ELASTOMERIC DAMMING AND DAMPING STRUCTURES

BACKGROUND

This relates generally to electronic devices and, more particularly, to reducing noise generated by components within electronic devices.

Electronic devices such as computers, cellular telephones, and other electronic devices often include printed circuits. Electrical components such as integrated circuits and other devices can be interconnected using signal traces on the printed circuits. Components such as ceramic capacitors are often mounted adjacent to integrated circuits to reduce power supply noise. Components such as these may exhibit electromechanical characteristics such as piezoelectric characteristics or electrostrictive characteristics that cause them to vibrate during operation. Vibrations can be coupled into printed circuits, which can result in undesirable audible noise for a user of an electronic device.

It would therefore be desirable to be able to reduce noise from electrical components in electronic devices.

SUMMARY

An electronic device may be provided with integrated circuits and electrical components such as capacitors. The integrated circuits and capacitors may be soldered to printed circuit boards. During operation, time-varying signals may be applied to the electrical components. For example, decoupling capacitors near integrated circuits may experience power supply voltage variations. This can give rise to potential vibrations in the capacitors. If care is not taken, there is a potential for these vibrations to create undesired noise, particularly in situations in which underfill is present under the edges or bottom of the capacitors that increases coupling of electromechanical forces from the capacitors to a printed circuit board on which the capacitors are mounted.

Vibrations and undesired noise may be suppressed using elastomeric material that prevents underfill from wicking under the capacitors when the underfill is being used to secure the integrated circuits to the printed circuit boards. To be effective, the elastomeric material preferably has better transmission characteristics than the underfill.

A liquid polymer adhesive dispensing tool may have a computer-controlled positioner for dispensing liquid adhesive such as liquid underfill and liquid elastomeric encapsulant. Using the dispensing tool, encapsulant and underfill materials may be deposited on the printed circuit. Initially, electrical components such as capacitors may be coated with the encapsulant. The underfill may be deposited adjacent to an integrated circuit, so that the underfill wicks into a gap between the integrated circuit and the printed circuit board. The encapsulant may be more viscous than the underfill. By coating the capacitors with the encapsulant or otherwise forming a barrier to the flow of underfill using the encapsulant, the underfill may be prevented from reaching the electrical components that have been covered with the encapsulant. After curing, the elastomeric material of the encapsulant may be less stiff than the underfill to help reduce coupling between the capacitors and the printed circuit board on which the capacitors are mounted and thereby reduce vibrations and noise. Vibrations and noise may also be reduced by placing elastomeric material on other portions of a printed circuit board.

DETAILED DESCRIPTION

An electronic device may be provided with electronic components that are interconnected by conductive traces on printed circuits. The printed circuits may include rigid printed circuit boards formed from materials such as fiberglass-filled epoxy and flexible printed circuits formed from sheets of polyimide or other flexible polymer layers. The electrical components may include integrated circuits, discrete components such as resistors, capacitors, and inductors, switches, and other electrical components.

Some components may have a tendency to produce vibrations during normal operation. For example, ceramic capacitors may include materials that tend to vibrate when subjected to electrical signal fluctuations. Electrical signal fluctuations may occur at 60 Hz, for example, as a graphics processor or other integrated circuit renders frames of display data at a frame rate of 60 Hz. Waveform shape may include higher harmonic content. Natural modes of the system can be excited by the fundamental and higher order harmonics and create acoustic noise efficiently. The presence of vibrating components such as ceramic capacitors may therefore create undesirable audible buzzing noises.

Buzzing noises and other undesirable audible artifacts from vibrating components can be minimized by incorporating elastomeric encapsulant structures into a printed circuit. The elastomeric encapsulant can prevent hard underfill material from wicking under vibrating components such as capacitors. This can help reduce coupling between the vibrating component and the printed circuit board. Elastomeric material can also be deposited on portions of a printed circuit board that are subject to vibrations to help damp the vibrations. For example, elastomeric material may be placed in gaps between a printed circuit board and an electronic device housing.

Figure 1:
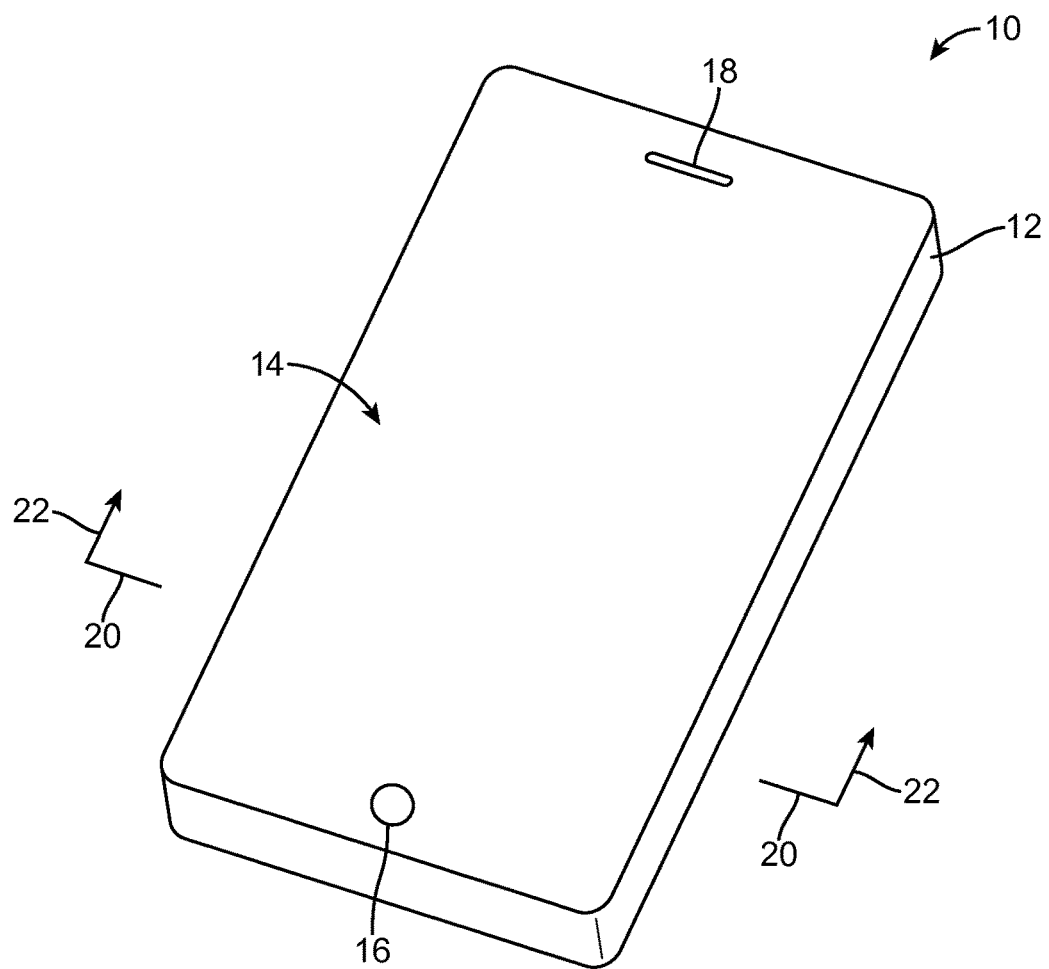
FIG. 1 is a perspective view of an illustrative electronic device such as a handheld computing device or other electronic device in accordance with an embodiment.

An illustrative electronic device of the type that may be provided with printed circuits having structures for reducing vibrations from vibrating components is shown in FIG. 1. Device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment is mounted in a kiosk or automobile, a router, a set-top box, equipment that implements the functionality of two or more of these devices, or other electronic equipment. In the illustrative configuration of FIG. 1, device 10 is a portable device such as a cellular telephone, media player, tablet computer, or other portable computing device.

Device 10 may have one or more displays such as display 14 mounted in housing structures such as housing 12. Housing 12 may be formed of materials such as plastic, glass, ceramics, carbon-fiber composites and other fiber-based composites, metal (e.g., machined aluminum, stainless steel, or other metals), other materials, or a combination of these materials. If desired, openings may be formed in display 14 to accommodate components such as button 16 and speaker port 18 of FIG. 1 (as examples). Buttons, connector ports, and other structures may also be accommodated using openings in housing 12.

Figure 2:
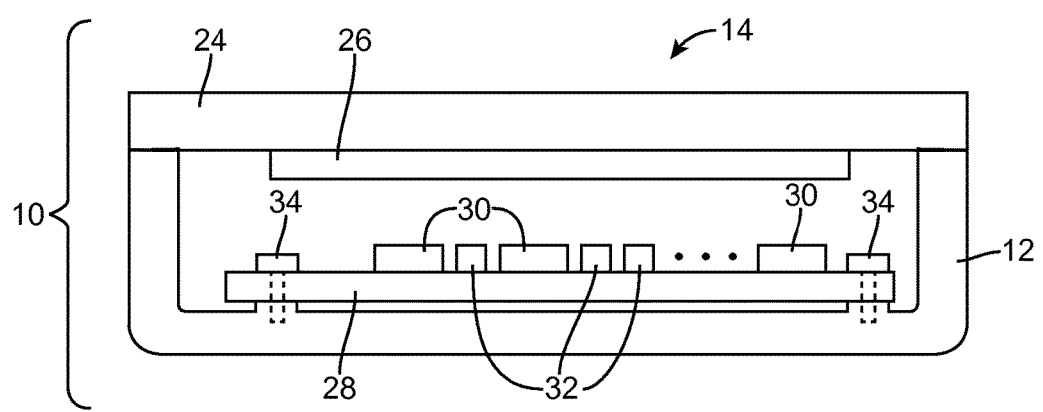
FIG. 2 is a cross-sectional side view of an illustrative electronic device in accordance with an embodiment.

FIG. 2 is a cross-sectional side view of electronic device 10 of FIG. 1 taken along line 20 and viewed in direction 22 of FIG. 1. As shown in FIG. 2, display 14 may be mounted in electronic device housing 12. Display 14 may include display cover layer 24 (e.g., a sheet of clear glass or plastic) and display layers 26. Display layers 26 may be associated with a liquid crystal display and may include structures such as a thin-film transistor layer, color filter layer, a layer of liquid crystal material, polarizer layers, and backlight structures. Other types of display technology may be used in forming display 14 if desired.

One or more printed circuits such as printed circuit 28 may be used to mount and interconnect electronic components in device 10. Printed circuit 28 may be, for example, a rigid printed circuit board formed from fiberglass-filled epoxy. Flexible printed circuits formed from polyimide layers or other sheets of flexible polymer may also be used in device 10, if desired. The amount of sound that is produced when vibrating components are mounted on rigid printed circuit boards tends to be greater than the amount of sound that is produced when vibrating components are mounted on flexible printed circuit boards, so sound minimizing techniques are sometimes described herein in the context of rigid printed circuit boards.

Electrical components such as components 30 and 32 may be mounted to printed circuit board 28 using solder or conductive adhesive. Components 30 and 32 may include integrated circuits, discrete components such as resistors, capacitors, and inductors, switches, sensors, connectors, audio components, etc. For example, components 30 may be integrated circuits such as graphics chips or other video processing circuits, microcontrollers, microprocessors, memory, application-specific integrated circuits, digital signal processors, or other integrated circuits. Components 32 may be components that are prone to vibration during operation such as ceramic capacitors or other components that exhibit piezoelectric and/or electrostrictive characteristics. For example, components 32 may be power supply decoupling capacitors that are mounted adjacent to integrated circuits 30.

With one suitable layout, integrated circuit 30 has a rectangular footprint and capacitors 32 are mounted on printed circuit board 28 along one or more sides of integrated circuit 30 or in a ring surrounding integrated circuit 30. There may be any suitable number of integrated circuits 30 on printed circuit board 28 (e.g., one or more, two or more, three or more, etc.) and there may be any suitable numbers of associated capacitors 32 (e.g., one or more, two or more, ten or more, fifty or more, etc.). Fasteners such as screws 34 may be used in attaching printed circuit 28 to housing 12. There may be one or more printed circuits 28 in device 10.

Figure 3:
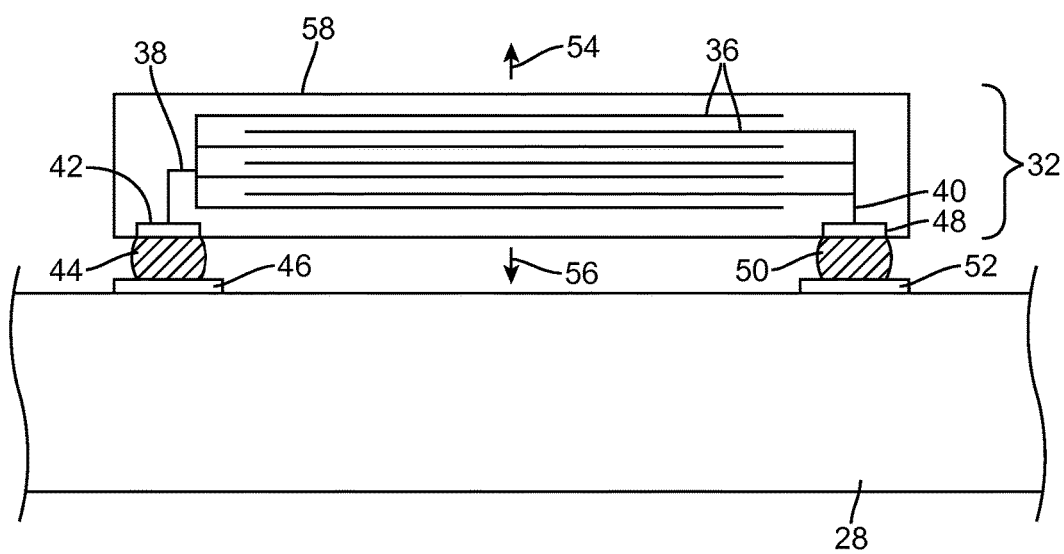
FIG. 3 is a cross-sectional side view of a component such as a capacitor mounted on a printed circuit board in accordance with an embodiment.

A cross-sectional side view of an illustrative capacitor of the type that may produce vibrations during operation is shown in FIG. 3. As shown in FIG. 3, capacitor 32 may have interleaved capacitor plates 36 mounted within housing 58. A first set of the plates may be electrically connected to capacitor terminal 38 and associated metal contact 42. A second set of the plates may be electrically connected to capacitor terminal 40 and associated metal contact 48. Contacts (terminals) 42 and 48 may mounted to printed circuit board 28 using conductive adhesive, solder, or other conductive materials. For example, capacitor contact 42 may be soldered to pad 46 on printed circuit board 28 using solder 44 and capacitor contact 48 may be soldered to pad 52 using solder 48.

The material that is used in forming capacitor plates 36 may move when signals are applied across terminals 42 and 48. For example, in ceramic capacitors, capacitor plates 36 may be formed from piezoelectric or electrostrictive material that expands and contracts as a function of applied voltage. When time-varying electrical signals such as power supply voltage fluctuations are applied across terminals 42 and 48 in a scenario in which capacitor 32 contains piezoelectric and/or electrostrictive layers 36, capacitor 32 will vibrate up in direction 54 and down in direction 56. These movements of capacitor 32 may be coupled to printed circuit board 28 through solder joints 44 and 48.

In conventional component mounting arrangements, thin liquid epoxy material commonly called underfill is used to secure integrated circuits to printed circuit boards. The underfill helps to prevent an integrated circuit from becoming detached from a printed circuit board in a drop event and to otherwise prevent integrated circuit connections from becoming damaged, cracked, disconnected, or detached during stress events. The underfill that is used to secure an integrated circuit to the printed circuit board may wick under nearby components such as ceramic capacitors. When cured, the underfill becomes stiff. The presence of stiff underfill between the underside of a vibrating capacitor and the upper surface of a printed circuit board may mechanically couple the capacitor to the underlying printed circuit board and thereby cause the printed circuit board to vibrate and produce noise.

To avoid undesired vibrational coupling effects of this type, the underfill may be prevented from flowing under capacitors such as capacitor 32. With one illustrative embodiment, an elastomeric material may be used to encapsulate capacitor 32 and thereby block the underfill as the underfill wicks under a nearby integrated circuit. The underfill may flow into contact with the elastomeric material. The elastomeric material may be more viscous than the underfill that flows into contact with the elastomeric material to prevent mixing of the underfill and the elastomeric material. To ensure satisfactory curing of the underfill and elastomeric material even in the event that there is a small amount of mixing at the interface between the underfill and the elastomeric material, the underfill and elastomeric material may be based on similar chemistries (i.e., the underfill and the elastomeric material may both be epoxy-based polymers). Additives may be incorporated into the epoxy of the elastomeric material to ensure that the elastomeric material is more viscous than the underfill. After curing (e.g., using time and elevated temperature), the underfill that has flowed under the integrated circuit will harden and help secure the integrated circuit to the printed circuit board. The elastomeric material will cure to a state that is resilient, softer, and less stiff than the underfill. When capacitor 32 vibrates during operation, the elastomeric nature of the elastomeric material that is adjacent to capacitor 32 will tend to exhibit reduced mechanical coupling with printed circuit board 28 and will tend to damp vibrations in capacitor 32 and printed circuit board 28 and thereby reduce noise.

Figure 4:
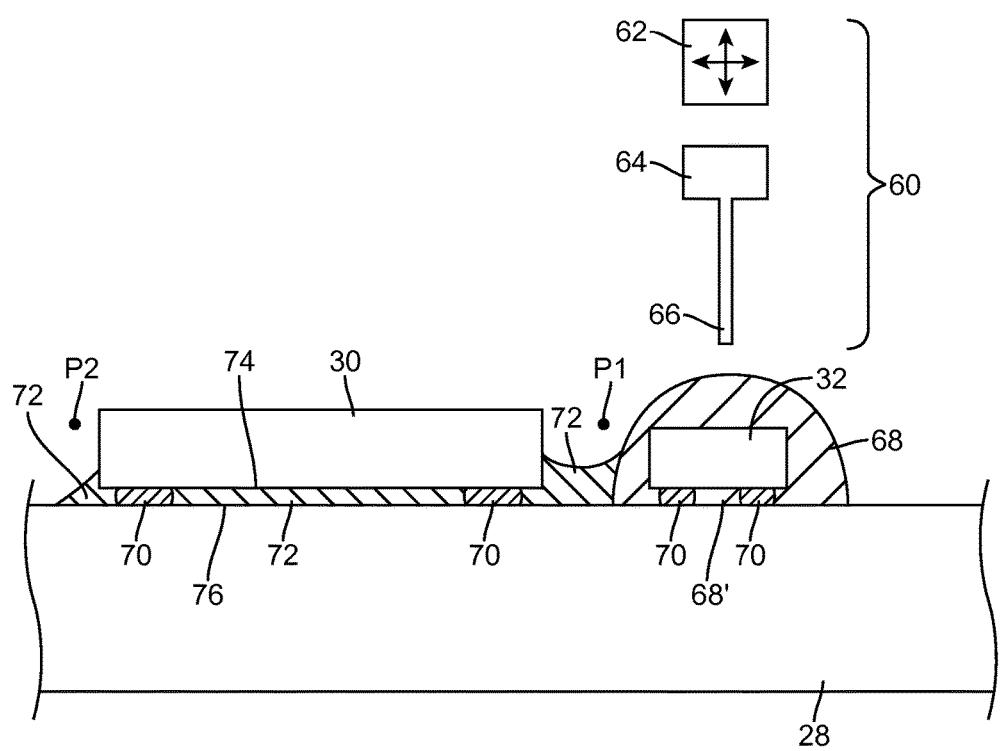
FIG. 4 is a cross-sectional side view of a portion of a printed circuit board showing how a component such as a capacitor may be encapsulated to prevent underfill from flowing under the capacitor in accordance with an embodiment.

FIG. 4 is a cross-sectional side view of an illustrative printed circuit board 28 on which components such as ceramic capacitor 32 and integrated circuit 30 have been mounted using solder 70. Liquid adhesive dispensing tool 60 may include computer-controlled positioner 62 and adhesive dispensing head 64. Nozzle 66 of head 64 may be used to dispense liquids such as liquid adhesives (e.g., liquid epoxies or other liquid polymer adhesives).

Using positioner 62, tool 60 may dispense liquid adhesive material onto various portions of the surface of printed circuit 28. For example, tool 60 may initially be used to dispense elastomeric material 68 over capacitor 32. The deposited elastomeric material may flow under capacitor 32, as illustrated by elastomeric material portion 68' in the FIG. 4 example. Elastomeric material 68 may be cured using heat, application of ultraviolet light, or other techniques. After dispensing elastomeric material 68 (and preferably before elastomeric material 68 has cured by applying heat or ultraviolet light), positioner 62 may position tool head 64 and nozzle 66 (or a separate nozzle) at a position such as position P1 (i.e., a position between integrated circuit 30 and capacitor 32 that is near the edge of integrated circuit 30) or position P2 (i.e., a position on the far side of integrated circuit 30 from capacitor 32. The use of underfill dispensing positions such as position P2 may help prevent underfill from flowing under capacitor 32 and may be used in scenarios in which no elastomeric material 68 has been deposited prior to underfill dispensing, if desired.

In the example of FIG. 4, elastomeric material 68 has been deposited over capacitor 32 by tool 60 prior to deposition of underfill 72. As a result, capacitor 32 is encapsulated and protected from underfill 72. Underfill 72 is less viscous than elastomeric material 68 and has a propensity to spread out on the surface of printed circuit 28 and to wick into cracks such as the gap between underside 74 of integrated circuit 30 and upper surface 76 of printed circuit board 28. Underfill 72 also tends to wick partway up the sidewalls of integrated circuit 30 (and, if not blocked by the presence of elastomeric material 68, would tend to wick up the sides of capacitor 32 and other components).

After curing, underfill 72 will be relatively stiff and will hold integrated circuit 30 to surface 76 of printed circuit board 28 in the event that printed circuit board 28 is dropped, whereas elastomeric material 68 will be less stiff (i.e., material 68 will have a lower modulus of elasticity). The reduced stiffness of cured elastomeric material 68 (sometimes referred to as encapsulant) and the absence of stiff underfill 72 will help reduce mechanical coupling of vibrations from capacitor 32 to printed circuit 28. The presence of elastomeric material 68 below and/or to the sides and/or above capacitor 32 and/or no printed circuit board 28 may also help damp vibrations.

Figure 5:
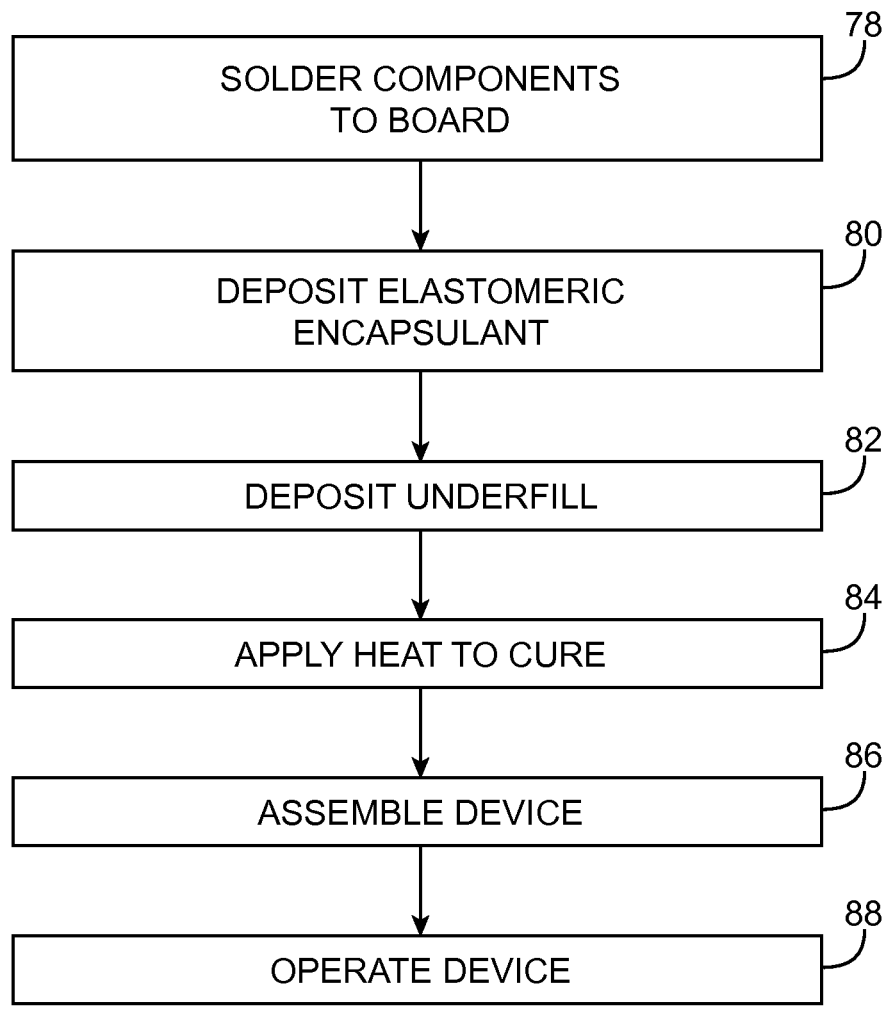
FIG. 5 is a flow chart of illustrative steps involved in forming electronic devices containing printed circuit boards with reduced vibrational noise in accordance with an embodiment.

Illustrative steps involved in forming and operating an electronic device having components such as one or more capacitors 32 (e.g., decoupling capacitors) mounted to a printed circuit board as described in connection with FIG. 4 are shown in FIG. 5. At step 78, electrical components may be mounted to printed circuit boards. For example, one or more integrated circuits 30 may be soldered to printed circuit board 28 and one or more capacitors 32 or other components that have the potential to vibrate during operation may be soldered to printed circuit board 28. Components such as capacitors 32 (e.g., coupling capacitors) may be located adjacent to integrated circuits 30. For example, there may be a rectangular ring of capacitors 32 surrounding each integrated circuit 30 or one or more rows of capacitors running along one or more edges of integrated circuit 30.

At step 80, elastomeric material 68 (sometimes referred to as encapsulant) may be deposited over capacitors 32 in liquid form using adhesive dispensing system 60. The deposited elastomeric material 68 may be patterned to form a drop, a strip (i.e., a line of adhesive when viewed from above printed circuit 28), a rectangular shape, a circular ring or rectangular ring, or other suitable shape.

At step 82, underfill 72 may be deposited by adhesive dispensing system 60 in liquid form. Underfill 72 may be deposited adjacent to capacitors 32 and integrated circuit 30. Underfill 72 may be formed from a liquid polymer adhesive such as liquid epoxy that is thin and able to wick into the gap between lower surface 74 of integrated circuit 30 and upper surface 76 of printed circuit 28. Uncured liquid elastomeric material 68 may be formed form a liquid polymer adhesive such as liquid epoxy with thickening additives that is more viscous than uncured liquid underfill 72. Because elastomeric material 68 is more viscous than underfill 72, underfill 72 will be prevented from wicking under capacitors 32. Underfill 72 and elastomeric adhesive 68 may both be formed from epoxies or may both be formed using another type of adhesive chemistry. If desired, elastomeric material may be applied to portions of printed circuit board 28 that tend to vibrate (e.g., to serve as sound deadening material and/or to damp vibrations by providing a cushion between printed circuit board 28 and housing 12).

At step 84, heat may be applied to printed circuit 28 to elevate the temperature of printed circuit 28, underfill 72, and elastomeric material 68 or ultraviolet light may be applied to cure elastomeric material 68. The applied heat (or ultraviolet light) cures underfill 72 to form a relatively stiff solid bond between integrated circuit 30 and printed circuit 28 and cures elastomeric material 68 to form a cured elastomeric material that is softer and less stiff than cured underfill 72.

At step 86, printed circuit 28 and other components of device 10 may be assembled together to form device 10. Device 10 may be operated by a user at step 86. Due to the absence of stiff underfill beneath capacitor 32 and/or due to the damping presence of elastomeric material 68 on and/or below capacitor 32 and/or on other portions of printed circuit board 28, vibrations from capacitor 32 will be only weakly coupled to printed circuit board 28 and/or will be damped by the vibration damping properties of elastomeric material 68. The user of device 10 will therefore be exposed to minimized amounts of vibration-induced noise while operating device 10 at step 88.

Figure 6:
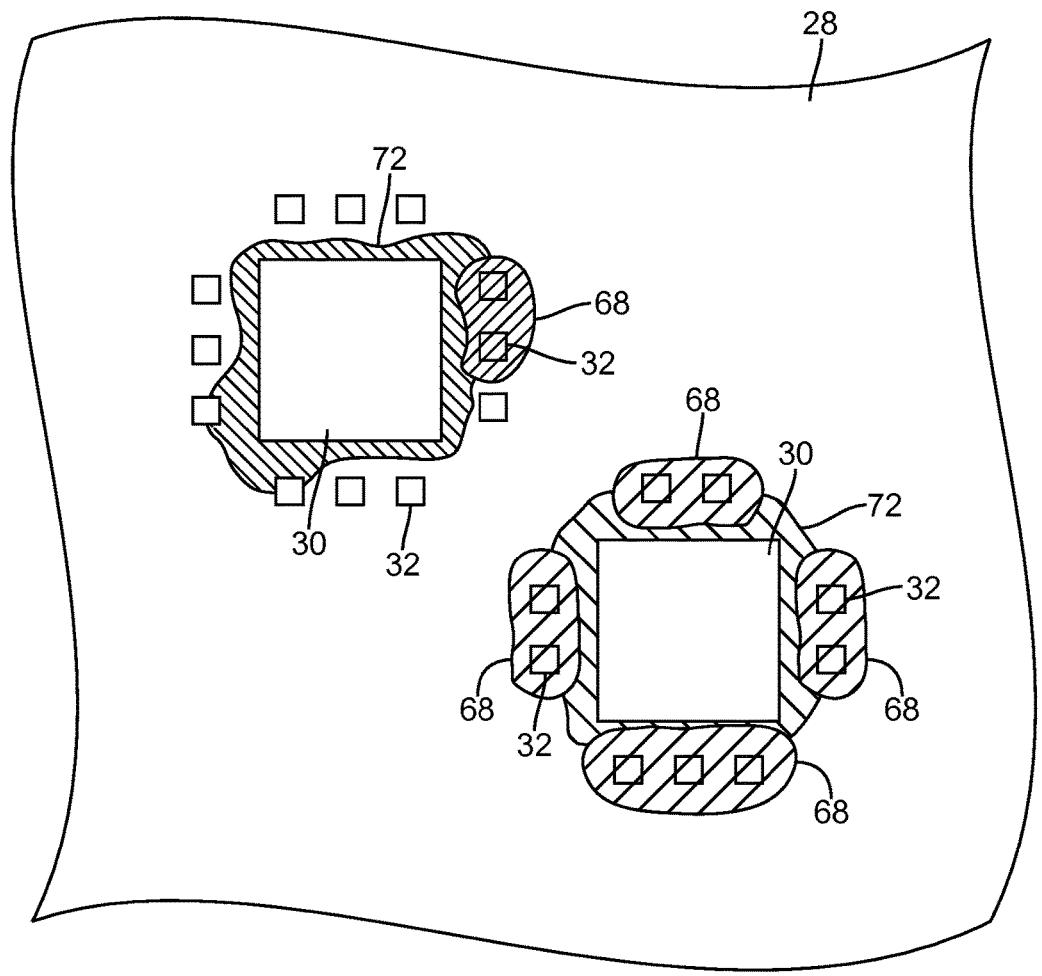
FIG. 6 is a top view of an illustrative printed circuit board on which encapsulant has been deposited prior to dispensing underfill to help prevent the underfill from flowing under vibrating components in accordance with an embodiment.

FIG. 6 is a top view of an illustrative layout for printed circuit board 28 on which two integrated circuits 30 have been mounted. In the upper left corner of printed circuit board 28, elastomeric encapsulant 68 has been placed over capacitors 32 running along the right-hand edge of integrated circuit 30 before applying underfill 72 to attach integrated circuit 30 to printed circuit board 28. In the lower right corner of printed circuit board 28, elastomeric encapsulant 68 has been deposited in four strips over the capacitors 32 that run along each of the four sides of integrated circuit 30 before applying underfill 72.

Figure 7:
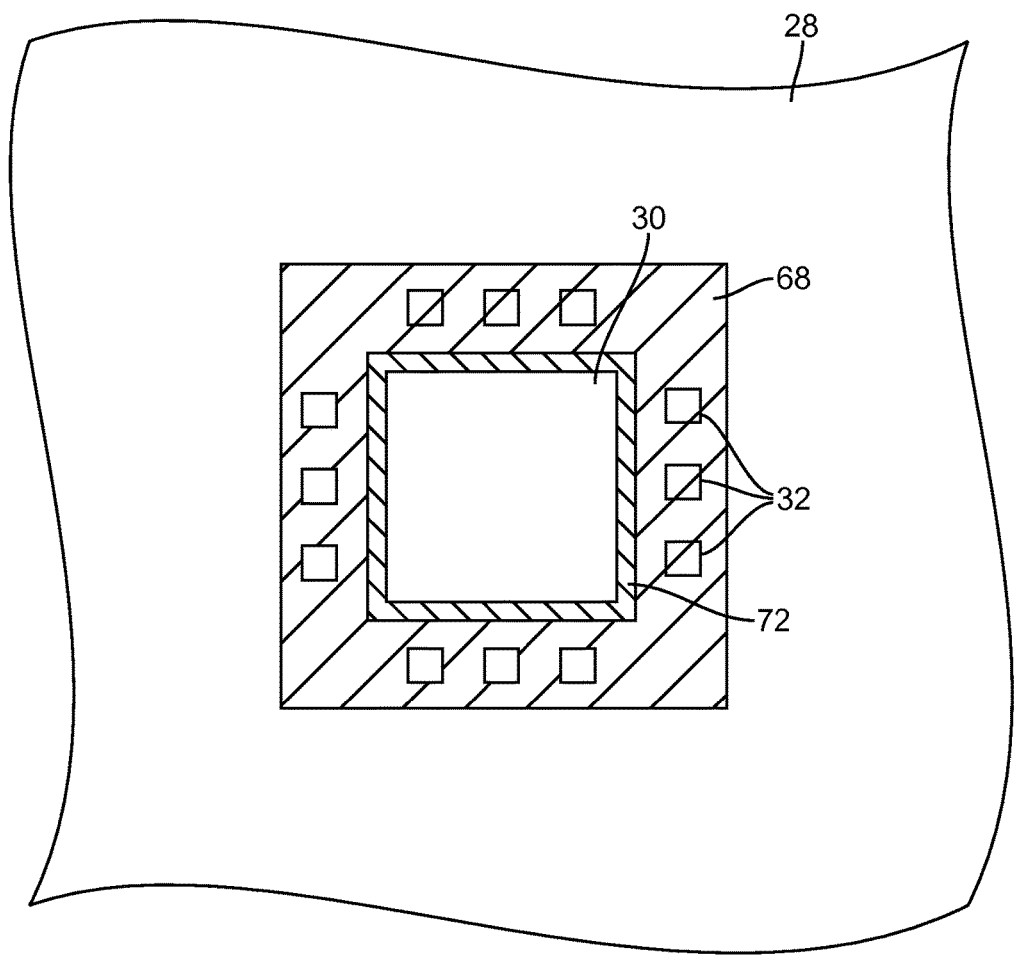
FIG. 7 is a top view of a printed circuit board on which a ring-shaped layer of encapsulant has been used to cover vibrating components to prevent underfill from flowing under the vibrating components in accordance with an embodiment.

FIG. 7 shows how elastomeric material 68 may be deposited in the shape of a rectangular ring that surrounds integrated circuit 30. In this configuration, elastomeric material 68 encapsulates vibrating components such as capacitors 32 while forming a ring-shaped barrier having a central opening that receives integrated circuit 30. Underfill 72 may be dispensed at a location along the outer edge of integrated circuit 30 so that underfill 72 flows under integrated circuit 30. Elastomeric material 68 surrounds and encloses underfill 72, thereby preventing underfill 72 from flowing outward to encapsulated capacitors 32.

Figure 8:
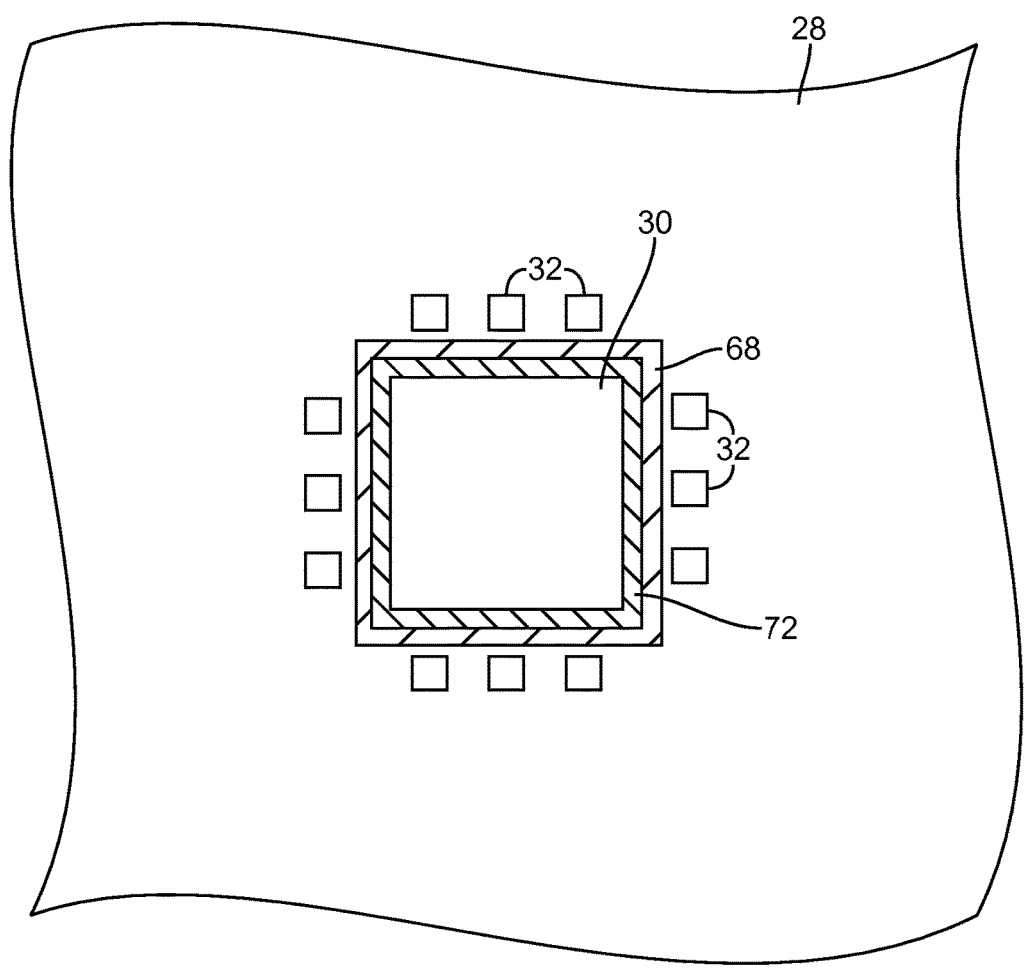
FIG. 8 is a top view of a printed circuit board on which a ring of encapsulant has been formed to prevent underfill from flowing outward from inside an opening in the center of the ring and under vibrating components located outside of the ring in accordance with an embodiment.

If desired, elastomeric material 68 may form a barrier to underfill 72 without covering capacitors 32. As shown in FIG. 8, for example, elastomeric material 68 may be deposited in a rectangular ring shape that runs along the four peripheral edges of integrated circuit 30 without covering capacitors 32. When underfill 72 is deposited on the surface of printed circuit 28 within the inner opening of the ring of elastomeric material 68, underfill 72 will wick under integrated circuit 30, but will be prevented from flowing outwards to capacitors 32 due to the presence of the barrier formed by elastomeric ring 68.

Figure 9:
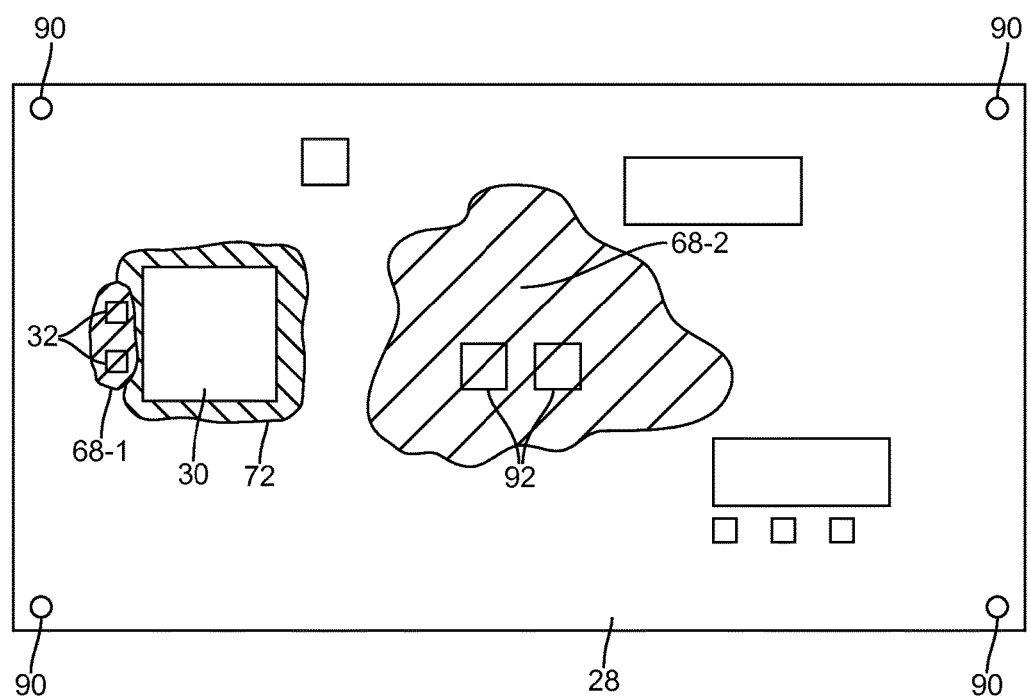
FIG. 9 is a top view of an illustrative printed circuit board on which vibration reducing material such as elastomeric encapsulant material is being used to damp printed circuit board vibrations in accordance with an embodiment.

Elastomeric material 68 may be deposited on portions of printed circuit board 28 other than the regions of printed circuit board containing capacitors 32 that are adjacent to integrated circuits 30. FIG. 9 is a top view of an illustrative printed circuit that has been provided with this type of elastomeric material. As shown in FIG. 9, printed circuit 28 may be attached to the housing of electronic device using screws 90. Some components such as capacitors 32 may be mounted adjacent to integrated circuits such as integrated circuit 30 (e.g., to serve as power supply decoupling capacitors). These capacitors may be coated with elastomeric material 68-1, so that underfill 72 is prevented from reaching capacitors 32 and does not overlap capacitors 32. In the example of FIG. 9, the portion of printed circuit 28 in the example of FIG. 9 that is most prone to vibrations is located in the center of printed circuit 28. To reduce vibrations in this area, elastomeric material 68-2 may be placed in the center of printed circuit board 28. In this configuration, elastomeric material 68-2 may damp vibration resulting in less efficient noise generation from printed circuit 28. If desired, elastomeric material 68-2 that is being used as vibration damping may optionally cover one or more electrical components such as components 92 (e.g., integrated circuits, etc.). Even if components 92 do not produce vibrations during operation, the presence of elastomeric material 68-2 may help damp vibration that has been imparted to printed circuit board by more distant components such as capacitors 32.

Figure 10:
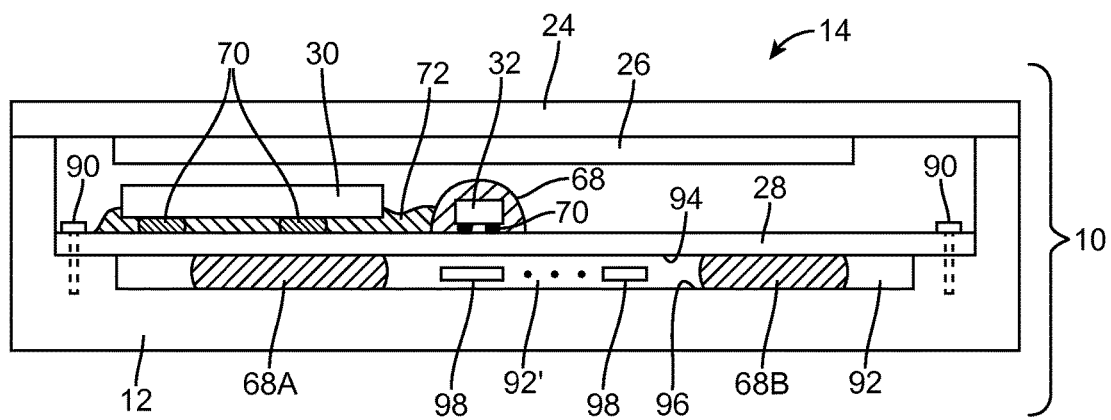
FIG. 10 is a cross-sectional side view of an illustrative electronic device in which vibration reducing material has been interposed between vibrating portions of a printed circuit board and nearby housing structures to reduce vibrations in the printed circuit board in accordance with an embodiment.

FIG. 10 shows how printed circuit board 28 may be mounted to housing 12 using screws 90. To reduce noise in this type of configuration, elastomeric material 68 may be deposited in one or more locations in gap 92 between lower surface 94 of printed circuit board 28 and upper (inner) surface 96 of housing 12 or elsewhere between printed circuit board 28 and housing 12. As shown in FIG. 10, when elastomeric material is deposited in multiple portions of gap 92, space may be made available for components 98. For example, components 98 may be mounted in portion 92' of gap 92 between elastomeric material 68A and elastomeric material 68B. Elastomeric material such as elastomeric material 68A and 68B forms a soft damping support structure between rigid device structures such as housing 12 and printed circuit board 28, thereby damping vibrations in printed circuit board 28. Elastomeric material may be placed against regions in printed circuit board 28 that are prone to vibrations (e.g., resonance locations) to maximize damping effectiveness.

The foregoing is merely illustrative and various modifications can be made by those skilled in the art without departing from the scope and spirit of the described embodiments. The foregoing embodiments may be implemented individually or in any combination.

What is claimed is:

1. Apparatus, comprising:
   an electronic device housing;
   a printed circuit board in the electronic device housing, wherein the printed circuit board has first and second opposing surfaces;
   an integrated circuit mounted on the first surface of the printed circuit board;
   an electrical component adjacent to the integrated circuit on the first surface of the printed circuit board;
   underfill between the integrated circuit and the first surface of the printed circuit board;
   elastomeric material between the underfill and the electrical component that prevents the underfill from reaching the electrical component; and
   additional elastomeric material between the electronic device housing and the second surface of the printed circuit board, wherein the additional elastomeric material is in direct contact with the electronic device housing and the second surface of the printed circuit board.

2. Apparatus, comprising:
   a printed circuit board;
   a capacitor soldered to the printed circuit board;
   an integrated circuit soldered to the printed circuit board;
   underfill having a portion that is between the integrated circuit and the printed circuit board that secures the integrated circuit to the printed circuit board; and
   a material that is less stiff than the underfill that blocks the underfill from reaching the capacitor.

3. The apparatus defined in claim 2 wherein the material comprises an elastomeric material.

4. The apparatus defined in claim 3 wherein the elastomeric material comprises encapsulant that covers the capacitor.

5. The apparatus defined in claim 4 wherein the elastomeric material has a portion that is located under the capacitor and between the capacitor and the printed circuit board.

6. The apparatus defined in claim 5 wherein the underfill contacts the elastomeric material.

7. The apparatus defined in claim 1, wherein the additional elastomeric material between the electronic device housing and the second surface of the printed circuit board is formed in a gap between the electronic device housing and the printed circuit board and at least one additional electronic component is mounted in the gap.

8. The apparatus defined in claim 7, further comprising:
a display mounted in the electronic device housing, wherein the electronic device housing has first and second opposing surfaces, the additional elastomeric material directly contacts the first surface of the electronic device housing, and the second surface of the electronic device housing forms an external surface of the apparatus.

* * * * *